United States Patent
Ko et al.

(10) Patent No.: US 7,808,025 B2
(45) Date of Patent: Oct. 5, 2010

(54) ELECTRIC FIELD READ/WRITE HEAD, METHOD OF MANUFACTURING THE SAME, AND INFORMATION STORAGE DEVICE COMPRISING THE ELECTRIC FIELD READ/WRITE HEAD

(75) Inventors: Hyoung-soo Ko, Seoul (KR); Chul-min Park, Yongin-si (KR); Ju-hwan Jung, Seoul (KR); Seung-bum Hong, Seongnam-si (KR); Dae-young Jeon, Mokpo-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 171 days.

(21) Appl. No.: 11/957,511

(22) Filed: Dec. 17, 2007

(65) Prior Publication Data

US 2009/0021862 A1    Jan. 22, 2009

(30) Foreign Application Priority Data

Jul. 16, 2007    (KR) ...................... 10-2007-0071286

(51) Int. Cl.
*G11B 9/00*    (2006.01)
*G11B 5/37*    (2006.01)

(52) U.S. Cl. .................. 257/295; 360/112; 369/126
(58) Field of Classification Search ................. 257/288, 257/295, 245; 369/126; 360/110–112; 365/209
See application file for complete search history.

(56) References Cited

U.S. PATENT DOCUMENTS

| | | | |
|---|---|---|---|
| 6,515,957 B1 * | 2/2003 | Newns et al. ............... | 369/126 |
| 6,607,923 B2 * | 8/2003 | Carr et al. ..................... | 438/3 |
| 2005/0231225 A1 * | 10/2005 | Park et al. ................... | 324/762 |

* cited by examiner

*Primary Examiner*—Kiesha R Bryant
*Assistant Examiner*—Mark W Tornow
(74) *Attorney, Agent, or Firm*—Sughrue Mion, PLLC

(57) ABSTRACT

An electric field read/write head, a method of manufacturing the same, and an information storage device including the electric field read/write head are provided. The electric field read/write head includes: a resistance region formed in a substrate which comprises an end surface facing a recording medium; a source and a drain formed in the substrate and disposed on both sides of the resistance region, respectively; and an insulating layer and a write electrode formed sequentially on the resistance region, wherein the length (l) to width (w) ratio (l/w) of the resistance region satisfies $(l/w) \geq 0.2$.

15 Claims, 8 Drawing Sheets

ELECTRIC FIELD READ/WRITE HEAD, METHOD OF MANUFACTURING THE SAME, AND INFORMATION STORAGE DEVICE COMPRISING THE ELECTRIC FIELD READ/WRITE HEAD

CROSS-REFERENCE TO RELATED PATENT APPLICATION

This application claims priority from Korean Patent Application No. 10-2007-0071286, filed on Jul. 16, 2007, in the Korean Intellectual Property Office, the disclosure of which is incorporated herein in its entirety by reference.

BACKGROUND OF THE INVENTION

1. Field of the Invention

Methods and apparatuses consistent with the present invention relate to a read/write head, a method of manufacturing the same, and an information storage device, and more particularly, to an electric field read/write head, a method of manufacturing the same, and an information storage device including the electric field read/write head.

2. Description of the Related Art

A Hard Disk Drive (HDD), which is used as a primary storage device of a computer, reads and writes data by rotating a data recording medium and suspending a read/write head over the data recording medium. A related art HDD generally uses a magnetic writing method. That is, the HDD uses a magnetic field to create a plurality of magnetic domains magnetized in a first direction on the magnetic recording medium and in a direction opposite to the first direction (hereinafter, referred to as a "second direction"). Magnetic domains magnetized in the first and second directions correspond to data values "0" and data "1", respectively.

HDDs employing this magnetic writing method have undergone tremendous increases in their recording densities over the last few decades. Horizontal magnetic writing on HDDs can produce approximately 100 Gb/in$^2$ in recording density, and vertical magnetic writing on HDDs can produce approximately 500 Gb/in$^2$ in recording density.

However, because a magnetic field has the basic shape of a loop, it is difficult for a magnetic read/write head to form a strong localized magnetic field. This basic limitation restricts the ability of the magnetic writing method to increase recording density.

Accordingly, in order to increase the recording density of HDDs that have traditionally used the related art magnetic writing method, other writing methods must be considered.

Recently, research has been conducted into ferroelectric writing media on which data is written using electric fields, instead of magnetic fields, and corresponding read/write heads (electric field read/write heads). The electric field writing method uses an electric field to form electric domains polarized in a first direction and in a direction opposite to the first direction on a ferroelectric surface. Electric domains polarized in the first and second directions correspond to data values "0" and data "1", respectively. The resistance of the electric field read/write head above an electric domain changes according to the polarized direction of the electric domain, so that the data written in the electric domain can be discerned.

An electric field read/write head for this electric field writing method can be a scanning probe with a field effect transistor channel configuration or a scanning probe with a resistive tip. When scanning probe microscope (SPM) technology in which the above scanning probes are used is utilized, a stronger and more localized energy (electric field) can be emitted in electric field writing than that in magnetic writing, thereby increasing recording density to 1 Tb/in$^2$ or higher.

However, in the electric field writing method based on SPM technology, a problem relating to friction and wear arises due to surfaces of a sharp probe and a recording medium contacting each other. Also, in order to use a probe-type head to form a compact and large-capacity data storage device, several thousand probe arrays must be formed, and the recording medium must be linearly moved to precisely track over the thousands of probe arrays on the recording medium. Here, during a writing operation, signals must be applied separately to each probe, and during a reading operation, signals from the respective probes must be processed separately. These restrictive elements prohibit the realization of a compact and large capacity data storage device that uses electric field writing based on SPM technology.

Thus, new read/write heads that can overcome the problems of using probes need to be used, and an information storage device using the electric field writing method to which a driving mechanism that is more secure and reliable is applied is required.

SUMMARY OF THE INVENTION

Exemplary embodiments of the present invention overcome the above disadvantages and other disadvantages not described above. Also, the present invention is not required to overcome the disadvantages described above, and an exemplary embodiment of the present invention may not overcome any of the problems described above.

An aspect of the present invention provides an electric field read/write head which can achieve a recording density of 1 Tb/in$^2$ or higher and which can be stably operated.

An aspect of the present invention also provides a method of manufacturing the electric field read/write head.

An aspect of the present invention also provides an information storage device including the electric field read/write head and a stable operating system.

According to an aspect of the present invention, there is provided an electric field read/write head including: a resistance region formed in a substrate which comprises an end surface facing a recording medium; a source and a drain formed in the substrate and disposed on both sides of the resistance region, respectively; and an insulating layer and a write electrode formed sequentially on the resistance region, wherein the length (l) to width (w) ratio (l/w) of the resistance region satisfies (l/w)≧0.2.

The length (l) to width (w) ratio (l/w) of the resistance region may satisfy (l/w)≧1. Here, the length (l) to width (w) ratio of the resistance region may be (l/w)≦50.

The length l of the resistance region may be 20 nm-1 μm.

The source may include a first part that is adjacent to the resistance region and a second part that is adjacent to the first part, wherein the width of the first part may be the same as the width w of the resistance region and the width of the second part may be greater than the width w of the resistance region.

The drain may include a third part that is adjacent to the resistance region and a fourth part that is adjacent to the third part, wherein the width of the third part may be the same as the width w of the resistance region and the width of the fourth part may be greater than the width w of the resistance region.

The electric field read/write head may further include an air bearing surface (ABS) pattern layer on a surface of the substrate facing the recording medium.

According to another aspect of the present invention, there is provided method of manufacturing an electric field read/ write head, the method including: preparing a substrate comprising a device isolation layer which defines an active region; doping conductive impurities into the active region in a low density; forming a stacked structure comprising an insulating layer and a write electrode, which crosses the center part of the active region on the substrate; doping conductive impurities into the active region disposed on both sides of the stacked structure in a high density to form a source and a drain and defining a resistance region which is a low density doped region between the source and the drain; and polishing a surface of the substrate facing a recording medium to remove a part of the resistance region.

The method may further include cutting the substrate after forming the source and the drain and before polishing the surface facing the recording medium, wherein the surface facing the recording medium is a surface exposed by the cutting.

The polishing may be performed while measuring a current between the source and the drain.

The method may further include forming an air bearing surface (ABS) pattern layer on the surface of the substrate facing the recording medium after polishing the surface of the substrate facing the recording medium.

The length (l) to width (w) ratio (l/w) of the resistance region may satisfy (l/w)≧0.2, or (l/w)≧1. Here, the length (l) to width (w) ratio (l/w) of the resistance region may be (l/w)≦50.

The length l of the resistance region may be 20 nm-1 μm.

The source may include a first part that is adjacent to the resistance region and a second part that is adjacent to the first part, wherein the width of the first part may be the same as the width w of the resistance region and the width of the second part may be greater than the width w of the resistance region.

The drain may include a third part that is adjacent to the resistance region and a fourth part that is adjacent to the third part, wherein the width of the third part may be the same as the width w of the resistance region and the width of the fourth part may be greater than the width w of the resistance region.

According to another aspect of the present invention, there is provided an information storage device including: a recording medium comprising a ferroelectric recording layer; and an electric field read/write head, wherein the electric field read/write head includes: a resistance region formed in a substrate which comprises an end surface facing a recording medium; a source and a drain formed in the substrate and disposed on both sides of the resistance region, respectively; and an insulating layer and a write electrode formed sequentially on the resistance region, wherein the length (l) to width (w) ratio (l/w) of the resistance region satisfies (l/w)≧0.2.

The length (l) to width (w) ratio (l/w) of the resistance region may satisfy (l/w)≧1, or (l/w)≦50.

The length l of the resistance region may be 20 nm-1 μm.

The source may include a first part that is adjacent to the resistance region and a second part that is adjacent to the first part, wherein the width of the first part may be the same as the width w of the resistance region and the width of the second part may be greater than the width w of the resistance region.

The drain may include a third part that is adjacent to the resistance region and a fourth part that is adjacent to the third part, wherein the width of the third part may be the same as the width w of the resistance region and the width of the fourth part may be greater than the width w of the resistance region.

The device may further include an air bearing surface (ABS) pattern layer on a surface of the substrate facing the recording medium.

The recording medium may be a rotating disk-type medium and the electric field read/write head may be suspended close to the surface of the recording medium.

BRIEF DESCRIPTION OF THE DRAWINGS

The above and other features of the present invention will become more apparent by describing in detail exemplary embodiments thereof with reference to the attached drawings in which.

DETAILED DESCRIPTION OF EXEMPLARY EMBODIMENTS OF THE INVENTION

Figure 1:
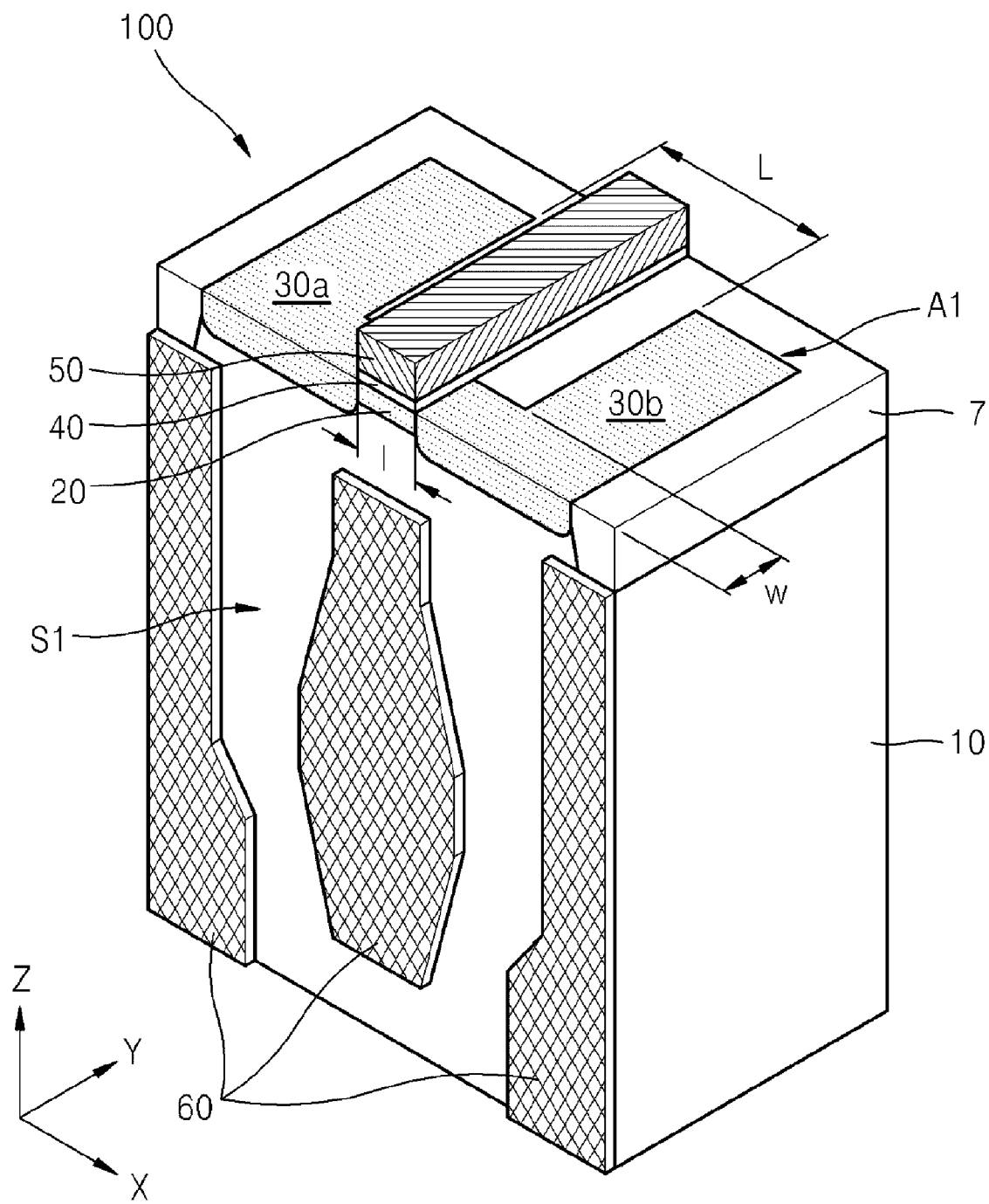
FIG. 1 is a perspective view of an electric field read/write head according to an exemplary embodiment of the present invention.

Hereinafter, the present invention will be described more fully with reference to the accompanying drawings, in which exemplary embodiments of the invention are shown. In the drawings, like reference numerals denote like elements, and the sizes and thicknesses of layers and regions are exaggerated for clarity FIG. 1 is a perspective view of an electric field read/write head 100 according to an exemplary embodiment of the present invention.

Referring to FIG. 1, a substrate 10 of the electric field read/write head 100 according to the current exemplary embodiment of the present invention includes a first surface S1 facing a recording medium and a second surface adjoining an edge of the first surface S1. The second surface of FIG. 1 is an upper surface of the substrate 10. The substrate 10 may be a hexahedron formed of a p-type or an n-type semiconductor.

The upper part of the substrate 10 includes a device isolation layer 7 which defines an active region A1. The device isolation layer 7 may be in the shape of the numeral 3 having an opening facing the first surface S1. Accordingly, the active region A1 may be U-shaped. The shape of the device isolation layer 7 and the active region A1 may vary. A resistance region 20 is located in the center part of the active region A1 according to the X-axis direction. The resistance region 20 extends from the center part of the end portion of the first surface S1 to the surface opposite to the first surface S1. Since an end surface of one side of the resistance region 20 is disposed in the first surface S1, the end surface of the resistance region 20 faces the recording medium. The resistance region 20 is doped with conductive impurities in a low density. When the substrate 10 is a p-type semiconductor, the resistance region 20 is an n-type impurity region. When the substrate 10 is an n-type semiconductor, the resistance region 20 is a p-type impurity region. The width w of the resistance region 20 is the same as the width of the center part of the active region A1. The length l of the resistance region 20 is shorter than a central projection part of the device isolation layer 7, that is, the length L of the ridge. The length (l) to width (w) ratio of the resistance region 20 may be (l/w)≧0.2. The reasons thereof will be described later.

Figure 2:
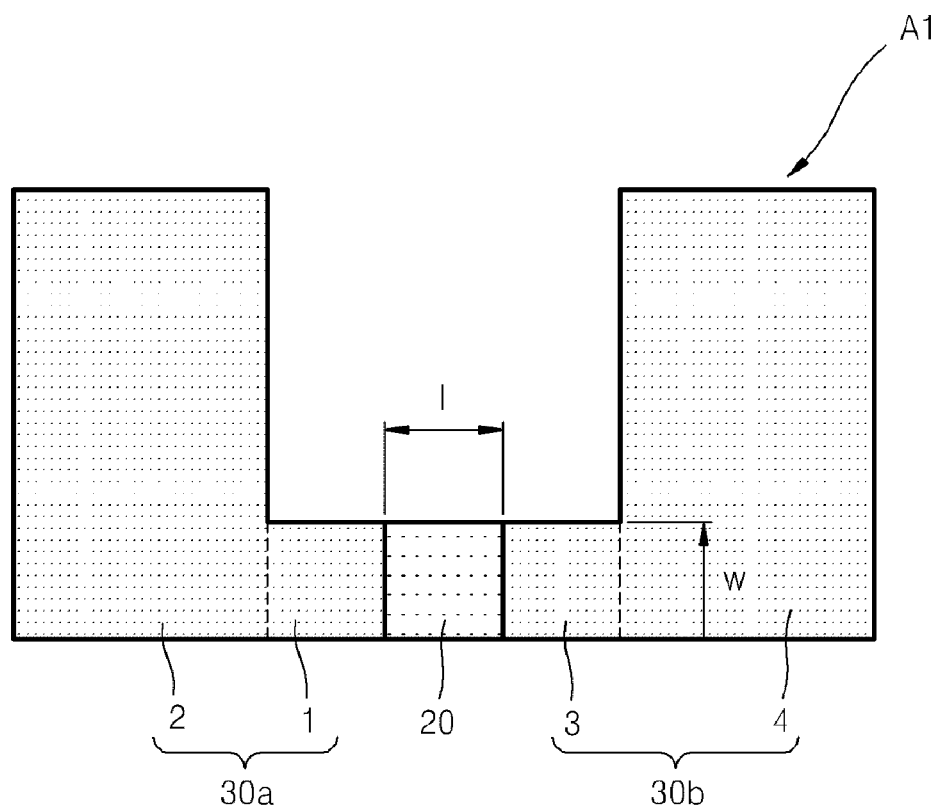
FIG. 2 is a plan view of an active region including a resistance region, a source and a drain of an electric field read/write head according to an exemplary embodiment of the present invention.

The active region A1 includes a source 30A and a drain 30B, respectively disposed on both sides of the resistance region 20. The source 30A and the drain 30B are regions where conductive impurities are doped in a high density. When the substrate 10 is a p-type semiconductor, the source 30A and the drain 30B are n-type impurity regions. When the substrate 10 is an n-type semiconductor, the source 30A and the drain 30B are p-type impurity regions. Since the source 30A and the drain 30B are included in the active region A1, except for the resistance region 20, the source 30A and the drain 30B can have symmetrical shapes centering about the resistance region 20. FIG. 2 is a plan view of the active region A1 including the source 30A, the drain 30B, and the resistance region 20, according to an exemplary embodiment of the present invention. Referring to FIG. 2, the source 30A can be formed of a first part 1 that is adjacent to the resistance region 20 and a second part 2 that is adjacent to the first part 1. Here, the width of the first part 1 is the same as the width w of the resistance region 20 and the width of the second part 2 may be greater than the width w of the resistance region 20. Similarly, the drain 30B can be formed of a third part 3 that is adjacent to the resistance region 20 and a fourth part 4 that is adjacent to the third part 3. Here, the width of the third part 3 is the same as the width w of the resistance region 20 and the width of the fourth part 4 may be greater that the width w of the resistance region 20. As such, when the second and fourth parts 2 and 4 are formed to be larger than the resistance region 20, an electrode respectively contacting the second and fourth parts 2 and 4 can be easily formed. The shapes of the source 30A, the drain 30B, and the resistance region 20 are not restricted to the drawings illustrated. The shapes of the source 30A, the drain 30B, and the resistance region 20 may vary by changing the shape of the active region A1.

Referring back to FIG. 1, an insulating layer 40 and a write electrode 50 are sequentially disposed on the resistance region 20. The insulating layer 40 and the write electrode 50 can be disposed on the device isolation layer 7 in a line form. The lengths of the insulating layer 40 and the write electrode 50 according to the X-axis direction can be the same as the length l of the resistance region 20.

An air bearing surface (ABS) pattern layer 60 may be formed on the first surface S1 of the substrate 10. The ABS pattern layer 60 allows the electric field read/write head 100 on which it is formed to be suspended over a recording medium.

First and second electrodes, which are not illustrated, may be formed to respectively contact the source 30A and the drain 30B.

In the electric field read/write head 100 according to the current exemplary embodiment of the present invention, the length to width ratio l:w of the resistance region 20 is (l/w)≧0.2, or 0.2≦(l/w)≦50, and for example, 1≦(l/w)≦50. Here, the length l of the resistance region 20 may be 20 nm-1 μm, for example, 20 nm-100 nm. When the resistance region 20 satisfies the above conditions, the resistance region 20 may have excellent sensitivity. When the length l/width w ratio of the resistance region 20 is less than 0.2, the resistance region 20 may have very low sensitivity, thereby having a difficulty in reading data. The reason thereof will be described with reference to FIG. 3.

Figure 3:
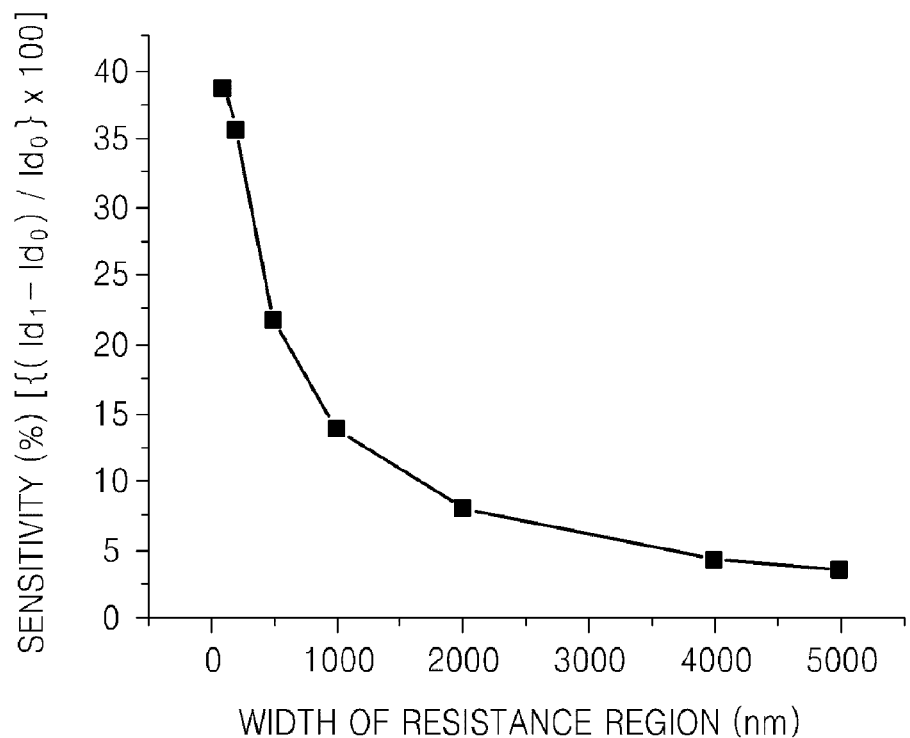
FIG. 3 is a graph illustrating a change of sensitivity according to a width of a resistance region in reading data using an electric field read/write head according to an exemplary embodiment of the present invention.

FIG. 3 is a graph illustrating a change of sensitivity according to the width of the resistance region 20 in reading data using the electric field read/write head 100 according to an exemplary embodiment of the present invention. In FIG. 3, the length l of the resistance region 20 is fixed at 1 μm and the width w of the resistance region 20 varies. Here, when a voltage applied to the resistance region 20 is 0V, a first drain current $Id_0$ is a current between the source 30A and the drain 30B and when a voltage applied to the resistance region 20 is +1V, a second drain current $Id_1$ is a current between the source 30A and the drain 30B.

Referring to FIG. 3, the width w of the resistance region 20 is inversely proportional to the sensitivity of the resistance region 20. Such problem may worsen when the length l of the resistance region 20 gets shorter, because interference between the source 30A and the drain 30B is increased in a short channel structure where the length l of the resistance region 20 is less than approximately 100 nm. Considering the length l of the resistance region 20 which may be 20 nm-100 nm, the width w of the resistance region 20 may be precisely adjusted to be less than 100 nm. Accordingly, when the length l/width w ratio of the resistance region 20 is not appropriately adjusted, it is difficult for the electric field read/write head 100 to have excellent sensitivity. In the present invention, when the length l/width w ratio of the resistance region 20 is adjusted to an appropriate value, the electric field read/write head 100 can have excellent sensitivity.

FIGS. 4A, 5A, 6A, 7A, 8, and 9 are plan views illustrating a method of manufacturing an electric field read/write head according to an exemplary embodiment of the present invention. FIGS. 4B, 5B, 6B, and 7B are sectional views of FIGS. 4A, 5A, 6A, and 7A, respectively, taken along a line a-a' of FIGS. 4A, 5A, 6A, and 7A.

Figure 4A:
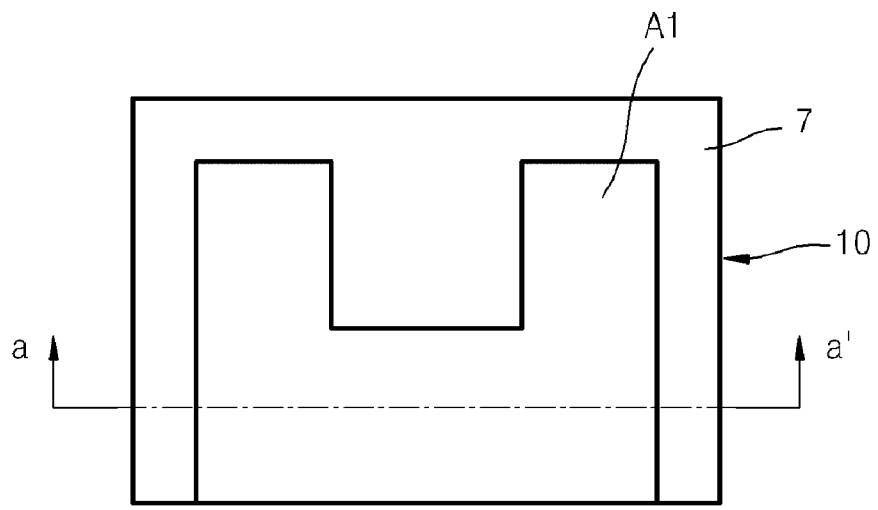
FIGS. 4A, 5A, 6A, 7A, 8, and 9 are plan views illustrating a method of manufacturing an electric field read/write head, according to an exemplary embodiment of the present invention.
Figure 4B:
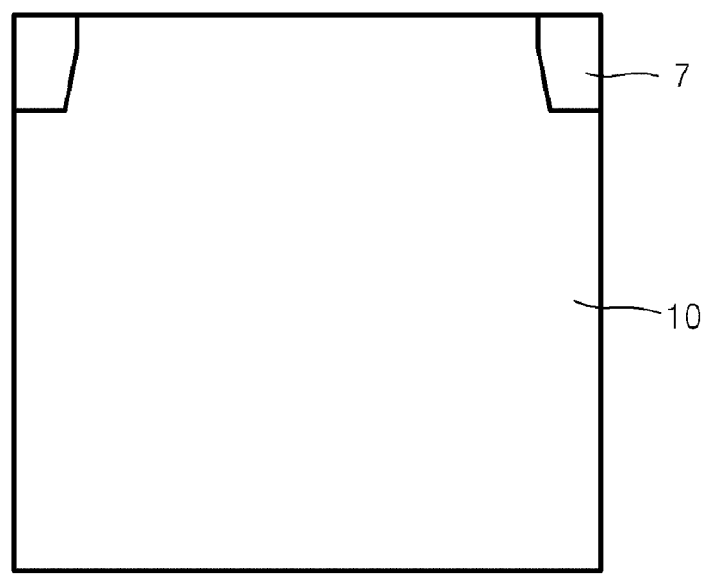
FIGS. 4B, 5B, 6B, and 7B are respective sectional views of FIGS. 4A, 5A, 6A, and 7A taken along the line a-a' of FIGS. 4A, 5A, 6A, and 7A, according to an exemplary embodiment of the present invention.

Referring to FIGS. 4A and 4B, a substrate 10 including a device isolation layer 7, which defines an active region A1, is prepared. The substrate 10 may be an n-type or a p-type semiconductor substrate. The device isolation layer 7 may be formed using a well-known shallow trench isolation (STI) method or a local oxidation of silicon (LOCOS) method. The shapes of the device isolation layer 7 and the active region A1 have been described above with reference to FIG. 1.

Figure 5A:
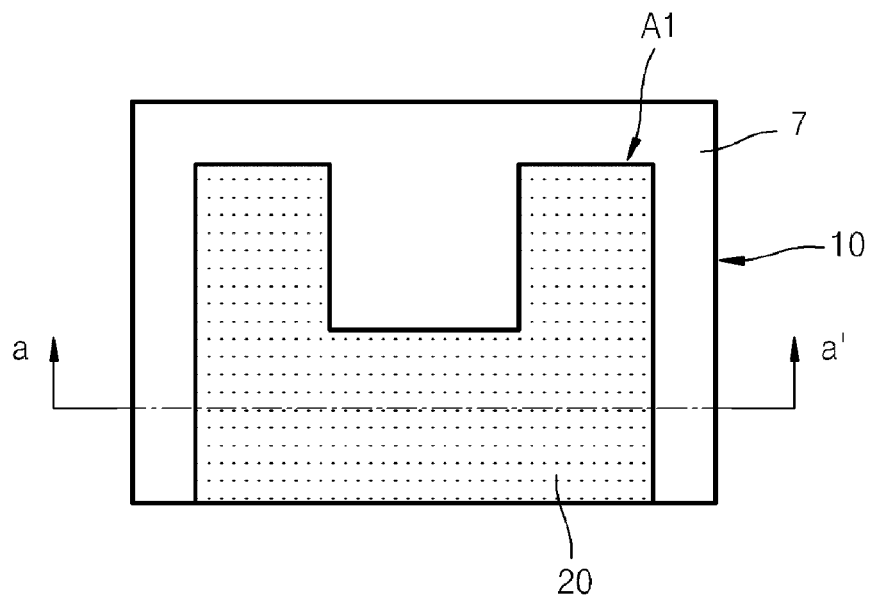
Figure 5B:
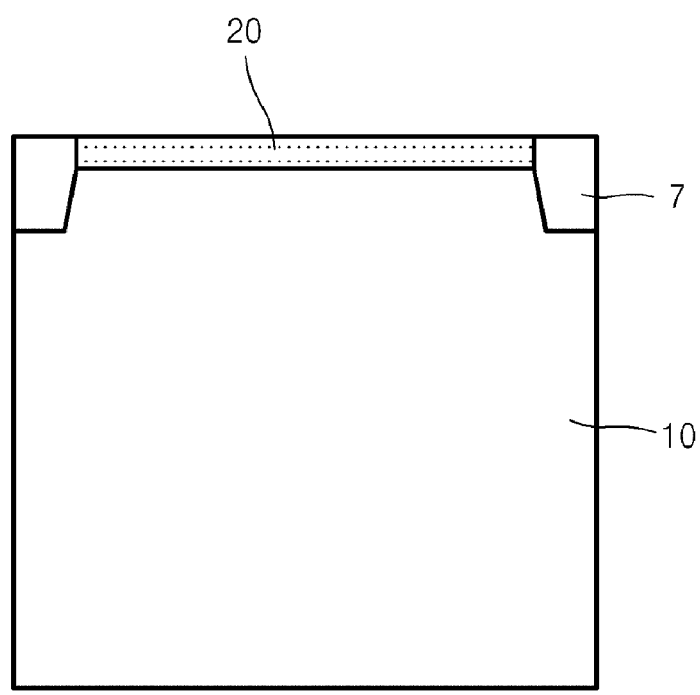

Referring to FIGS. 5A and 5B, conductive impurities are doped into the active region A1 in a low density to form a low density impurity region 20. Here, when the substrate 10 is an n-type semiconductor substrate, p-type impurities are doped into the active region A1, and when the substrate 10 is a p-type semiconductor, n-type impurities are doped into the active region A1.

Figure 6A:
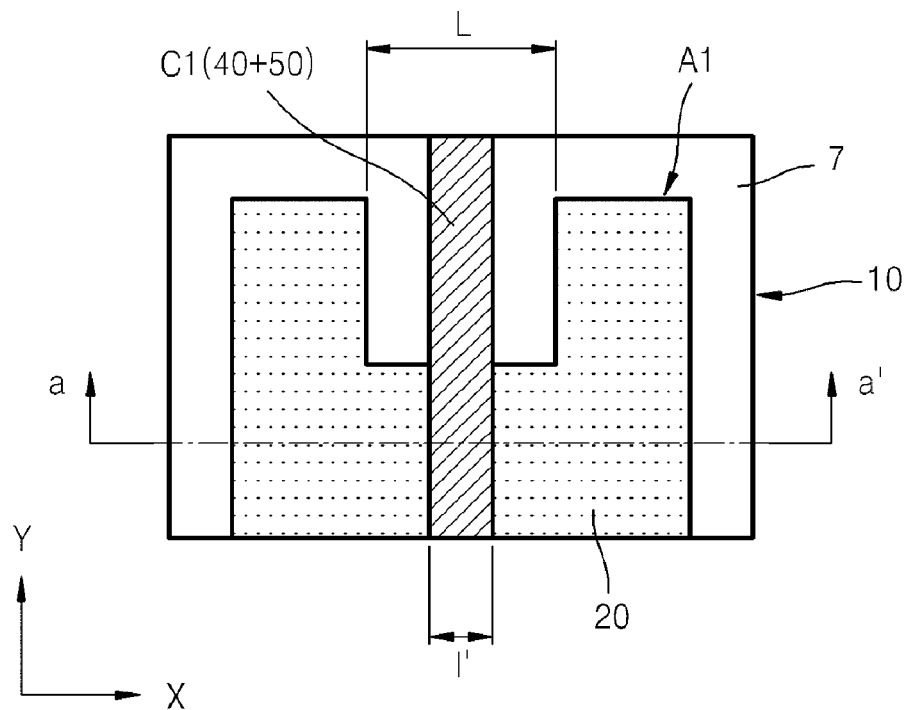
Figure 6B:
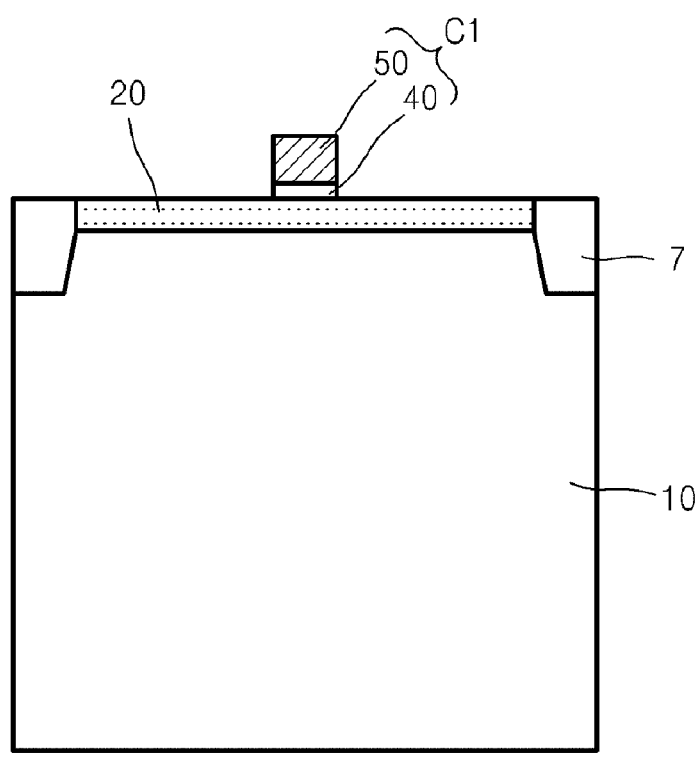

Referring to FIGS. 6A and 6B, a stacked structure C1 which crosses the center part of the substrate 10 and extends in a Y-axis direction of the active region A1 is formed on the substrate 10. The stacked structure C1 is line-shaped and can be formed on the device isolation layer 7. A length l' of the stacked structure C1 is shorter than the length L of the ridge of the device isolation layer 7, that is, a central projection part of the device isolation layer 7. The length l' of the stacked structure C1 may be 20 nm-1 μm, for example, 20 nm-100 nm. As illustrated in FIG. 6B, the stacked structure C1 is a structure in which the insulating layer 40 and the write electrode 50 are sequentially stacked. The insulating layer 40 may include a silicon oxide layer and the write electrode 50 may include at least one of a metal and a conductive semiconductor.

Figure 7A:
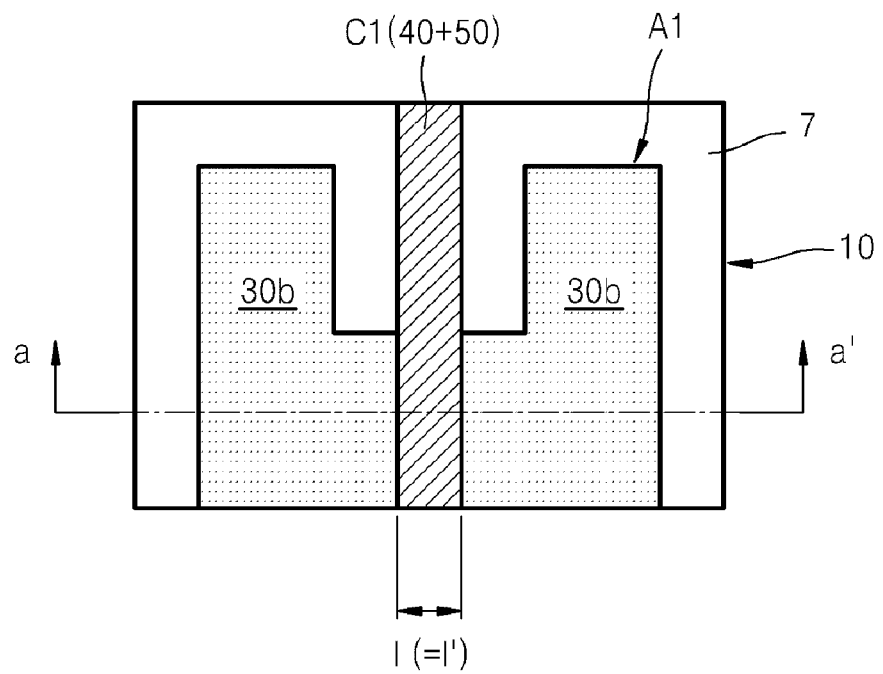
Figure 7B:
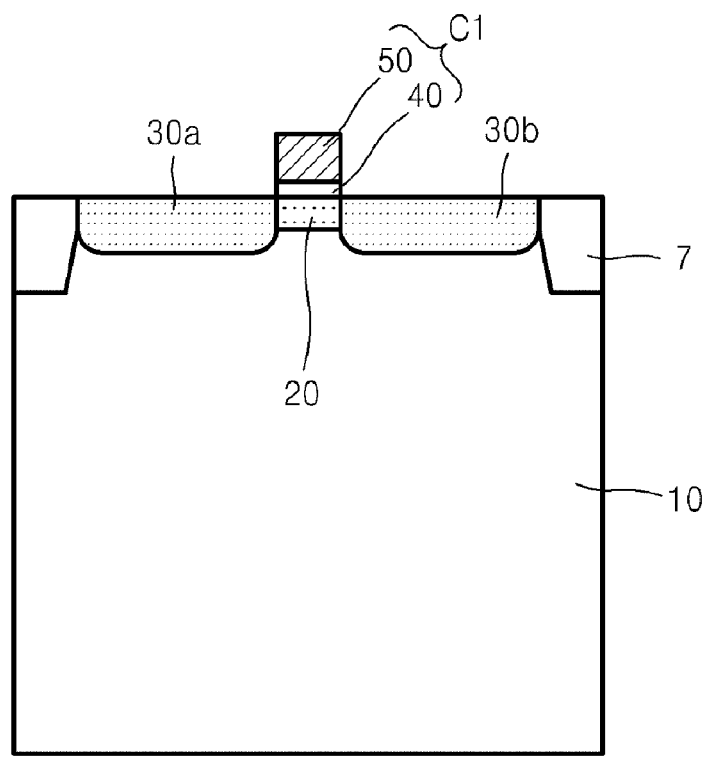

Referring to FIGS. 7A and 7B, conductive impurities are doped in a high density using an ion implantation mask in the active region A1 disposed on both sides of the stacked structure C1 to form a source 30A and a drain 30B. The impurities used here can be the same as the impurities used to form the low density impurity region 20 in FIG. 4A. The doping density of the low density impurity region 20 covered by the stacked structure C1 is lower than the doping density of the source 30A and the drain 30B. Hereinafter, the low density impurity region 20 between the source 30A and the drain 30B will be referred to as the resistance region 20. The length l of the resistance region 20 is the same as the length l' of the stacked structure C1. Since the location of the resistance region 20 is automatically determined by the write electrode 50, a misalignment problem does not occur between the write electrode 50 and the resistance region 20.

Figure 8:
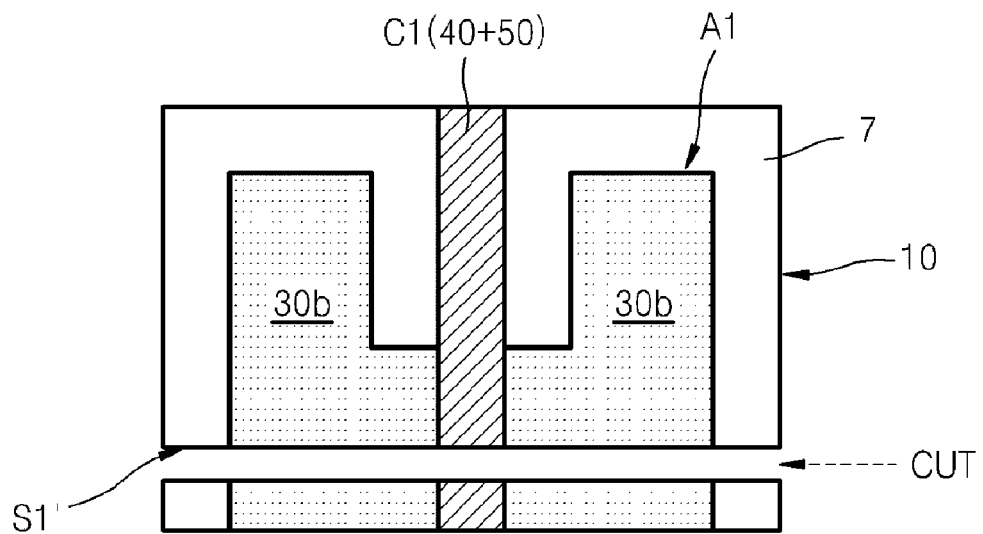

Referring to FIG. 8, the substrate 10 and the stacked structure C1 formed on the substrate 10 are cut in a direction perpendicular to the write electrode 50. Here, the cut section is determined in the resistance region 20 of FIG. 7B. According to the cut, portions of the resistance region 20, the source 30A, the drain 30B, the stacked structure C1, and the device isolation layer 7 are cut. Such cutting process may be optional.

Figure 9:
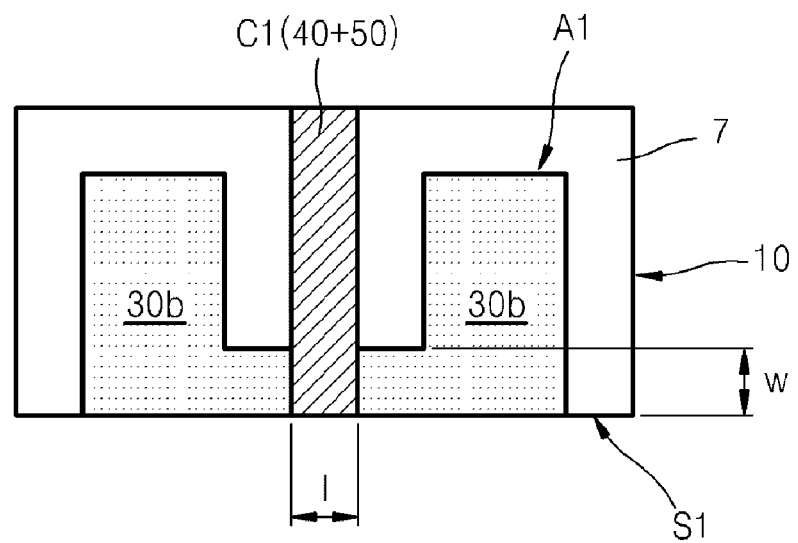

Then, a surface exposed by the cutting process, that is, a surface S1', is polished to remove a portion of the resistance region 20. The resultant structure is illustrated in FIG. 9. In FIG. 9, reference numeral S1 is referred to as a surface facing the recording medium. Through such polishing, the width w of the resistance region 20 can be fixed to a desired level. Here, the width w of the resistance region 20 may be determined by considering the length l of the resistance region 20. For example, the polishing process should be performed to satisfy the length (l) to width (w) ratio of the resistance region 20 to be $(l/w) \geq 0.2$, or $0.2 \leq (l/w) \leq 50$, for example, $1 \leq (l/w) \leq 50$.

The polishing process should be performed while measuring a current between the source 30A and the drain 30B, that is, measuring electric resistance of the resistance region 20. Here, the measured electric resistance of the resistance region 20 can be compared with a reference resistance. The polishing process can be performed until the electric resistance of the resistance region 20 matches the reference resistance.

A portion of the write electrode 50 is removed by the polishing process. End surfaces of the write electrode 50 and the resistance region 20, which face the recording medium and on which the polishing process has been performed, exist on the same plane.

As not illustrated, electrodes which respectively contact to the source 30A and the drain 30B can be formed after forming the source 30A and the drain 30B in FIG. 7A and before cutting the substrate 10 of FIG. 8. In addition, an ABS pattern layer can be formed on the surface S1 facing the medium.

Meanwhile, a method of manufacturing an electric field read/write head from a wafer, according to an exemplary embodiment of the present invention, is as follows. The electric field read/write head 100 of FIG. 1 can be manufactured by using the method including: forming at least one set formed of the device isolation layer 7, the resistance region 20, the source 30A, the drain 30B, the insulating layer 40, and the write electrode 50; grouping the sets into a plurality of groups and cutting the wafer to separate the groups into units; polishing the cut section of the unit; forming the ABS pattern layer on the surface facing the medium in the unit; and separating the unit on which the ABS pattern layer is formed into the electric field read/write head. Here, the cutting the wafer may be the same as the cutting process of FIG. 8.

Figure 10:
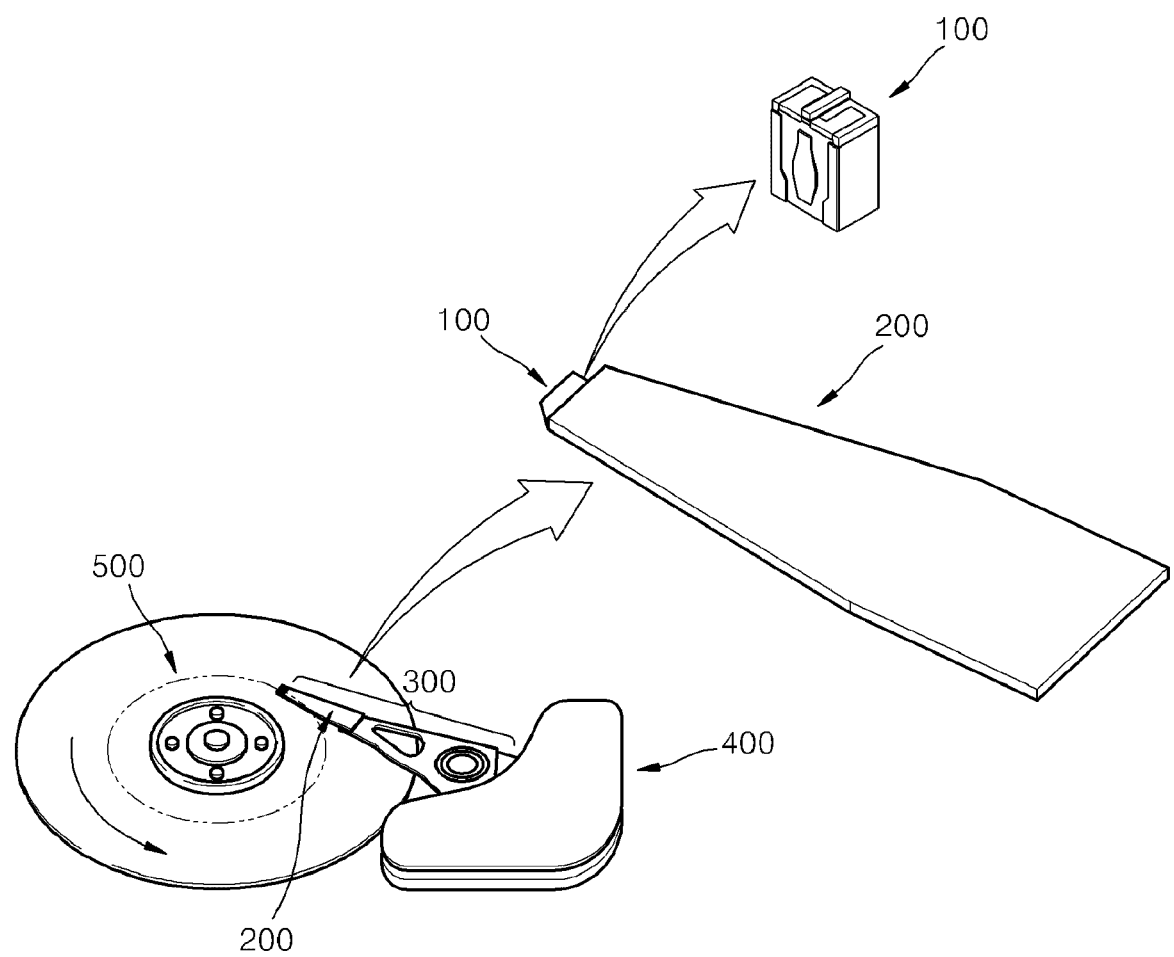
FIG. 10 is a perspective view of an information storage device including an electric field read/write head according to an exemplary embodiment of the present invention.

FIG. 10 is a perspective view of an information storage device including an electric field read/write head 100, according to an exemplary embodiment of the present invention.

Referring to FIG. 10, the information storage device according to the present exemplary embodiment includes a recording medium 500 with a ferroelectric recording layer and the electric field read/write head 100. The electric field read/write head 100 writes data on the recording medium 500 and reads data from the recording medium 500. Here, the electric field read/write head 100 is the same as the electric field read/write head 100 of the exemplary embodiment of the present invention described with reference to FIG. 1, and thus a detailed description thereof shall not be repeated.

The recording medium 500 of the information storage device according to the present exemplary embodiment is a rotating disk-type medium having a lower electrode (not shown) provided below a lower surface thereof. The lower electrode may be grounded. The electric field read/write head 100 is attached to a suspension 200 at the tip of a swing arm 300 and suspended close to an upper surface of the recording medium 500. Reference numeral 400 signifies a voice coil motor (VCM) which rotates the swing arm 300. The information storage device according to the present exemplary embodiment has an operating system similar to that of a related art HDD.

The reading and writing principles of the information storage device according to the present exemplary embodiment will now be briefly described.

<Reading Principles>

When a source 30A and a drain 30B of the electric field read/write head 100 are n+ regions, the resistance region 20 is a n− region, and the surface charge of the recording medium 500 on which the resistance region 20 is located, has a negative (−) charge, the density of electrons in the resistance region 20 is reduced so that the resistance value of the resistance region 20 increases and current between the source 30A and the drain 30B is reduced. Conversely, when the surface charge of the recording medium 500, on which the resistance region 20 is located, has a positive (+) charge, the electron density in the resistance region 20 increases so as to reduce the resistance value of the resistance region 20 and increase the current between the source 30A and the drain 30B. By detecting the changes in these resistance and current values, data recorded on the surface of the recording medium 500 can be read.

<Writing Principles>

When a positive (+) voltage exceeding a critical voltage is applied to the write electrode 50 of the electric field read/write head 100, since the lower electrode disposed below the recording medium 500 has a voltage of 0V, the surface of the recording medium 500 becomes negatively (−) charged. On the other hand, when a negative voltage (−) less than a critical voltage is applied to the write electrode 50 of the electric field read/write head 100, since the lower electrode disposed below the recording medium 500 has a voltage of 0V, the surface of the recording medium 500 becomes positively (+) charged. Accordingly, the polarity of an electric domain of the recording medium 500 shifts according to the voltage applied to the write electrode 50, and data can be written to the recording medium 500.

As described above, an electric field recording method is applied to the operating system of a HDD so that the system is stably operated, regardless of a burden of developing the system, and an information storage device having a recording density of 1 Tb/in$^2$ or higher can be realized.

In particular, in the exemplary embodiments of the present invention, the length l/width w ratio of the resistance region is fixed to have a specific value so that sensitivity of the electric field read/write head can increase.

Moreover, in the method of manufacturing the electric field read/write head of the exemplary embodiment of the present invention, since the location of the resistance region may be automatically determined by the write electrode, misalignment of the resistance region and the write electrode does not occur.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An electric field read/write head comprising:
a substrate having a first surface facing a recording medium and a second surface being substantially perpendicular to the first surface;
a resistance region having a predetermined length and a predetermined width and formed in the second surface of the substrate, wherein the resistance region comprises an end surface having the predetermined length and facing the recording medium and disposed in the first surface;
a source formed in the second surface of the substrate and disposed on a first side of the resistance region;
a drain formed in the second surface of the substrate and disposed on a second side of the resistance region; and
an insulating layer and a write electrode formed sequentially on the resistance region in the second surface,
wherein a ratio l/w is greater than or equal to 0.2, where l is the predetermined length of the resistance region and w is the predetermined width of the resistance region.

2. The electric field read/write head of claim 1, wherein the ratio l/w is greater than or equal to 1.

3. The electric field read/write head of claim 1, wherein the ratio l/w is less than or equal to 50.

4. The electric field read/write head of claim 1, wherein the predetermined length of the resistance region is in a range of 20 nm-1 µm.

5. The electric field read/write head of claim 1, wherein the source comprises a first part that is adjacent to the resistance region and a second part that is adjacent to the first part, wherein a width of the first part is equal to the predetermined width of the resistance region and a width of the second part is greater than the predetermined width of the resistance region.

6. The electric field read/write head of claim 1, wherein the drain comprises a third part that is adjacent to the resistance region and a fourth part that is adjacent to the third part, wherein a width of the third part is equal to the predetermined width of the resistance region and a width of the fourth part is greater than the predetermined width of the resistance region.

7. The electric field read/write head of claim 1, further comprising an air bearing surface (ABS) pattern layer on the first surface of the substrate facing the recording medium.

8. An information storage device comprising:
a recording medium comprising a ferroelectric recording layer; and an electric field read/write head,
wherein the electric field read/write head comprises:
a substrate having a first surface facing the recording medium and a second surface being substantially perpendicular to the first surface;
a resistance region having a predetermined length and a predetermined width and formed in the second surface of the substrate, wherein the resistance region comprises an end surface having the predetermined length and facing the recording medium and disposed in the first surface;
a source formed in the second surface of the substrate and disposed on a first side of the resistance region;
a drain formed in the second surface of the substrate and disposed on a second side of the resistance region; and
an insulating layer and a write electrode formed sequentially on the resistance region in the second surface,
wherein a ratio l/w is greater than or equal to 0.2, where l is the predetermined length of the resistance region and w is the predetermined width of the resistance region.

9. The device of claim 8, wherein the ratio l/w is greater than or equal to 1.

10. The device of claim 8, wherein the ratio l/w is less than or equal to 50.

11. The device of claim 8, wherein the predetermined length of the resistance region is in a range of 20 nm-1 µm.

12. The device of claim 8, wherein the source comprises a first part that is adjacent to the resistance region and a second part that is adjacent to the first part, wherein a width of the first part is equal to the predetermined width of the resistance region and a width of the second part is greater than the predetermined width of the resistance region.

13. The device of claim 8, wherein the drain comprises a third part that is adjacent to the resistance region and a fourth part that is adjacent to the third part, wherein a width of the third part is equal to the predetermined width of the resistance region and a width of the fourth part is greater than the predetermined width of the resistance region.

14. The device of claim 8, further comprising an air bearing surface (ABS) pattern layer on the first surface of the substrate facing the recording medium.

15. The device of claim 8, wherein the recording medium is a rotating disk-type medium and the electric field read/write head is suspended close to a surface of the recording medium.

* * * * *